(12) United States Patent
Lee et al.

(10) Patent No.: US 8,525,391 B2
(45) Date of Patent: Sep. 3, 2013

(54) PIEZOELECTRIC POWER APPARATUS

(75) Inventors: Hsien-Hua Lee, Kaohsiung (TW);
Teng-Chieh Tsou, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 346 days.

(21) Appl. No.: 12/907,153

(22) Filed: Oct. 19, 2010

(65) Prior Publication Data
US 2011/0260583 A1 Oct. 27, 2011

(30) Foreign Application Priority Data

Apr. 27, 2010 (TW) .............................. 99113346 A

(51) Int. Cl.
*H02N 2/18* (2006.01)
(52) U.S. Cl.
CPC ...................................... *H02N 2/18* (2013.01)
USPC ......................................................... 310/339
(58) Field of Classification Search
CPC ....................................................... H02N 2/18
USPC ................................ 310/323.01–323.21, 328
See application file for complete search history.

(56) References Cited

U.S. PATENT DOCUMENTS

| 2005/0162042 A1* | 7/2005 | Krill .............................. 310/328 |
| 2008/0100181 A1* | 5/2008 | Clingman et al. ............. 310/339 |
| 2008/0314356 A1* | 12/2008 | Kamen et al. ............... 123/197.3 |

* cited by examiner

*Primary Examiner* — Derek Rosenau
(74) *Attorney, Agent, or Firm* — Jackson IPG PLLC

(57) ABSTRACT

A piezoelectric power apparatus comprises a first case, at least one piezoelectric module and a rotating member, wherein the first case has a bottom surface and at least one hollow chamber recessed into the bottom surface, and the piezoelectric module is disposed into the hollow chamber. The piezoelectric module comprises at least one frame body, a moving member and a plurality of piezoelectric portions. The moving member is penetrated into the frame body. Each of the piezoelectric portions comprises a first end and a second end, each of the first ends is fixed at the frame body, each of the second ends is fixed at the moving member, and the moving member is moved back and forth in the frame body. The moving member is pivotally disposed at the rotating member.

8 Claims, 6 Drawing Sheets

PIEZOELECTRIC POWER APPARATUS

FIELD OF THE INVENTION

The present invention is generally relating to a piezoelectric power apparatus, more particularly to a piezoelectric power apparatus that can generate power by wind force or wave power.

BACKGROUND OF THE INVENTION

Referring to FIG. 1, a conventional piezoelectric power apparatus 300 comprises a vibrator 310 having at least one swing member 311, a plurality of piezoelectric portions 320, a plurality of electrodes 330 and a plurality of fan blades 340. The swing member 311 comprises a first side 312, a second side 313 corresponded to the first side 312, a first combining member 314 and a second combining member 315. The piezoelectric portions 320 are formed at the first side 312 and the second side 313 of the vibrator 310 separately. Each of the electrodes 330 is connected with each of the piezoelectric portions 320. The fan blades 340 are fixed at the first combining member 314 and the second combining member 315 separately and the swing member 311 of the vibrator 310 can be driven by the fan blades 340 to enable the piezoelectric portions 320 to be deformed to generate voltages. However, in the design of the piezoelectric power apparatus 300, the quantity of the piezoelectric portions 320 can not be effectively increased. Accordingly, the output power of the piezoelectric power apparatus 300 is limited.

SUMMARY

A primary object of the present invention is to provide a piezoelectric power apparatus comprising a first case, at least one piezoelectric module and a rotating member, wherein the first case has a bottom surface and at least one hollow chamber recessed into the bottom surface, and the piezoelectric module is disposed into the hollow chamber. The piezoelectric module comprises at least one frame body, a moving member and a plurality of piezoelectric portions. The moving member is penetrated into the frame body. Each of the piezoelectric portions comprises a first end and a second end, each of the first ends is fixed at the frame body, each of the second ends is fixed at the moving member, and the moving member is moved back and forth in the frame body. The moving member is pivotally disposed at the rotating member. This invention enables the moving member of each of the piezoelectric modules to be driven by the rotating member simultaneously. Therefore, the moving member of each of the piezoelectric modules is able to move back and forth in the frame body. Besides, the quantity of the piezoelectric module can be effectively increased so that the power of the piezoelectric power apparatus can be effectively raised as well.

DETAILED DESCRIPTION OF THE INVENTION

Figure 1:
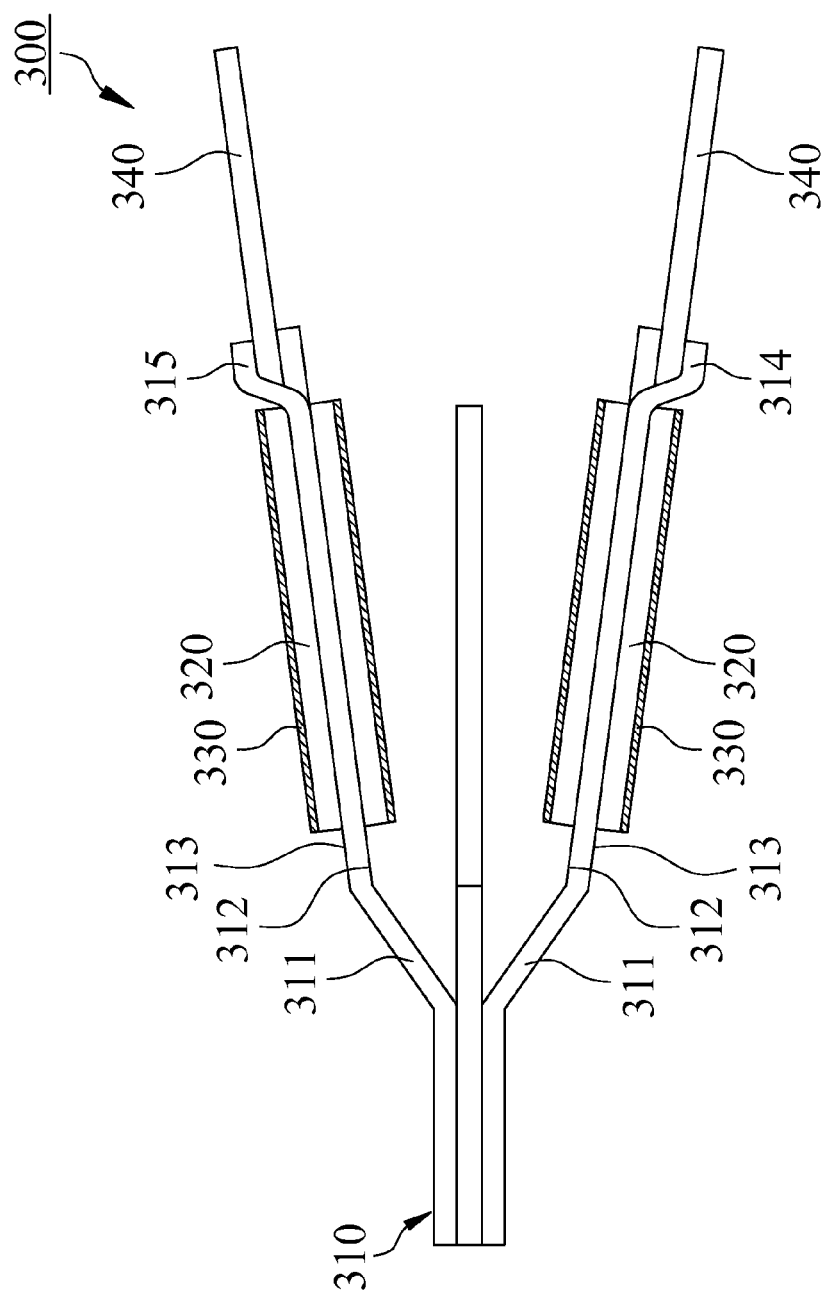
FIG. 1 is a top view illustrating conventional piezoelectric power apparatus.
Figure 2:
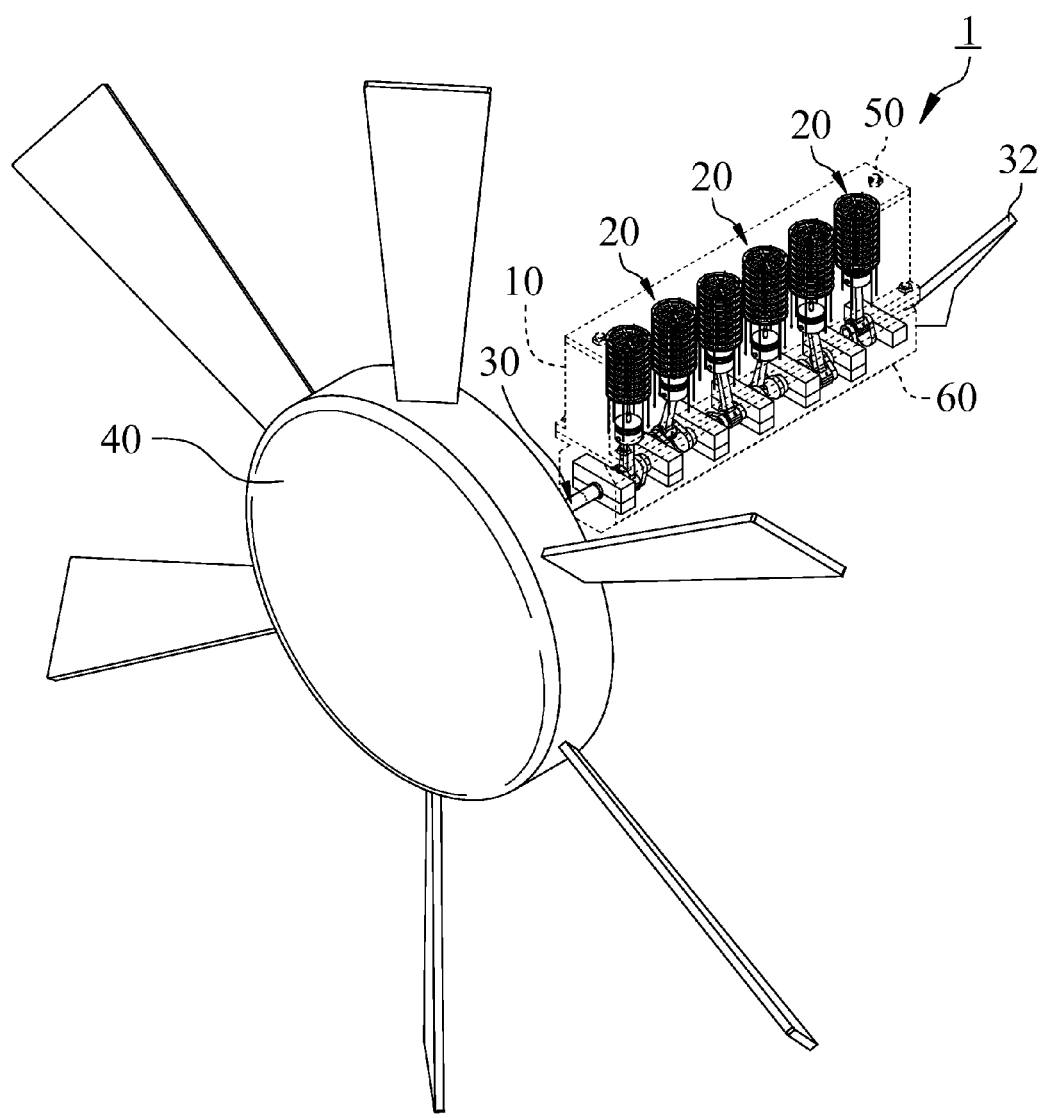
FIG. 2 is a perspective assembly view illustrating a piezoelectric power apparatus in accordance with an embodiment of the present invention.
Figure 3:
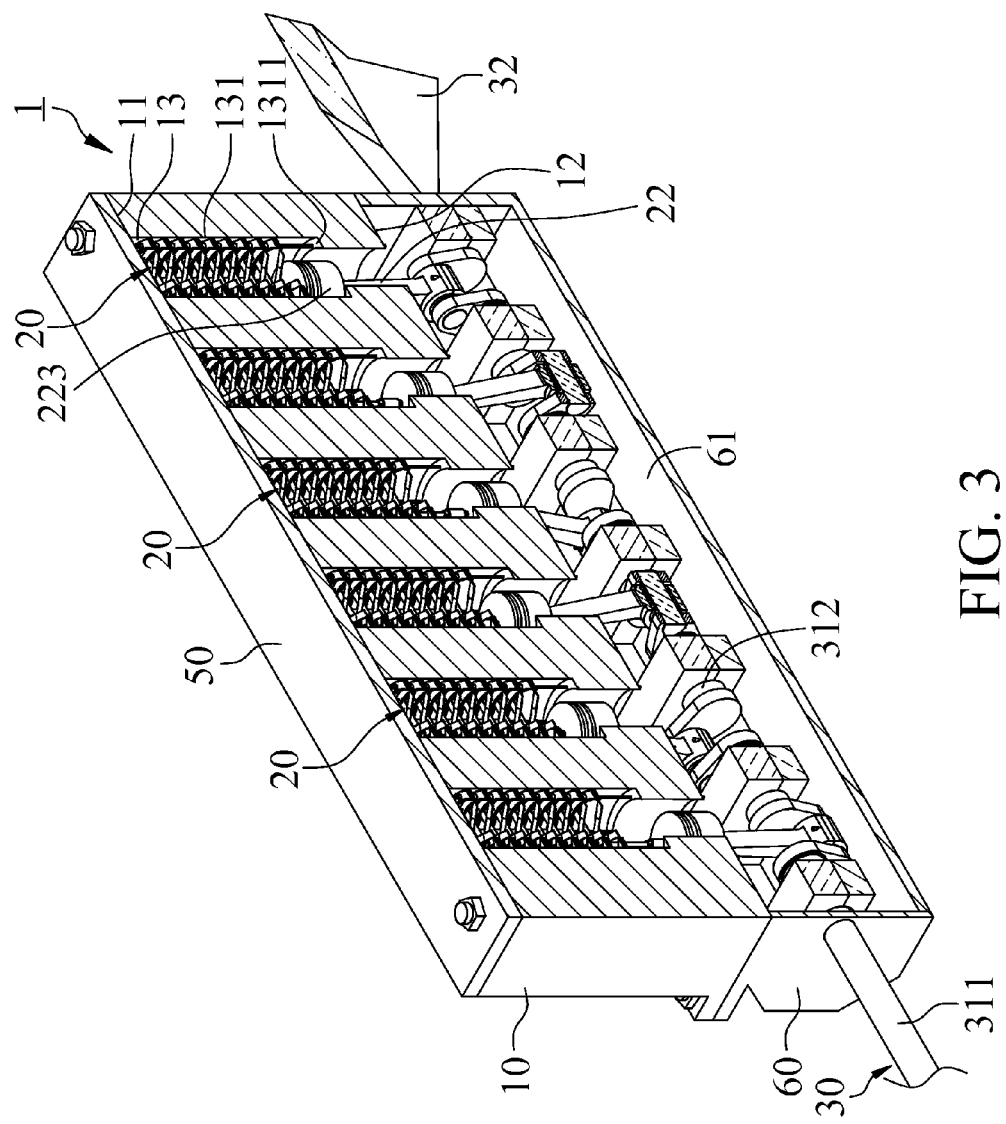
FIG. 3 is a perspective section view illustrating a piezoelectric power apparatus in accordance with an embodiment of the present invention.
Figure 4:
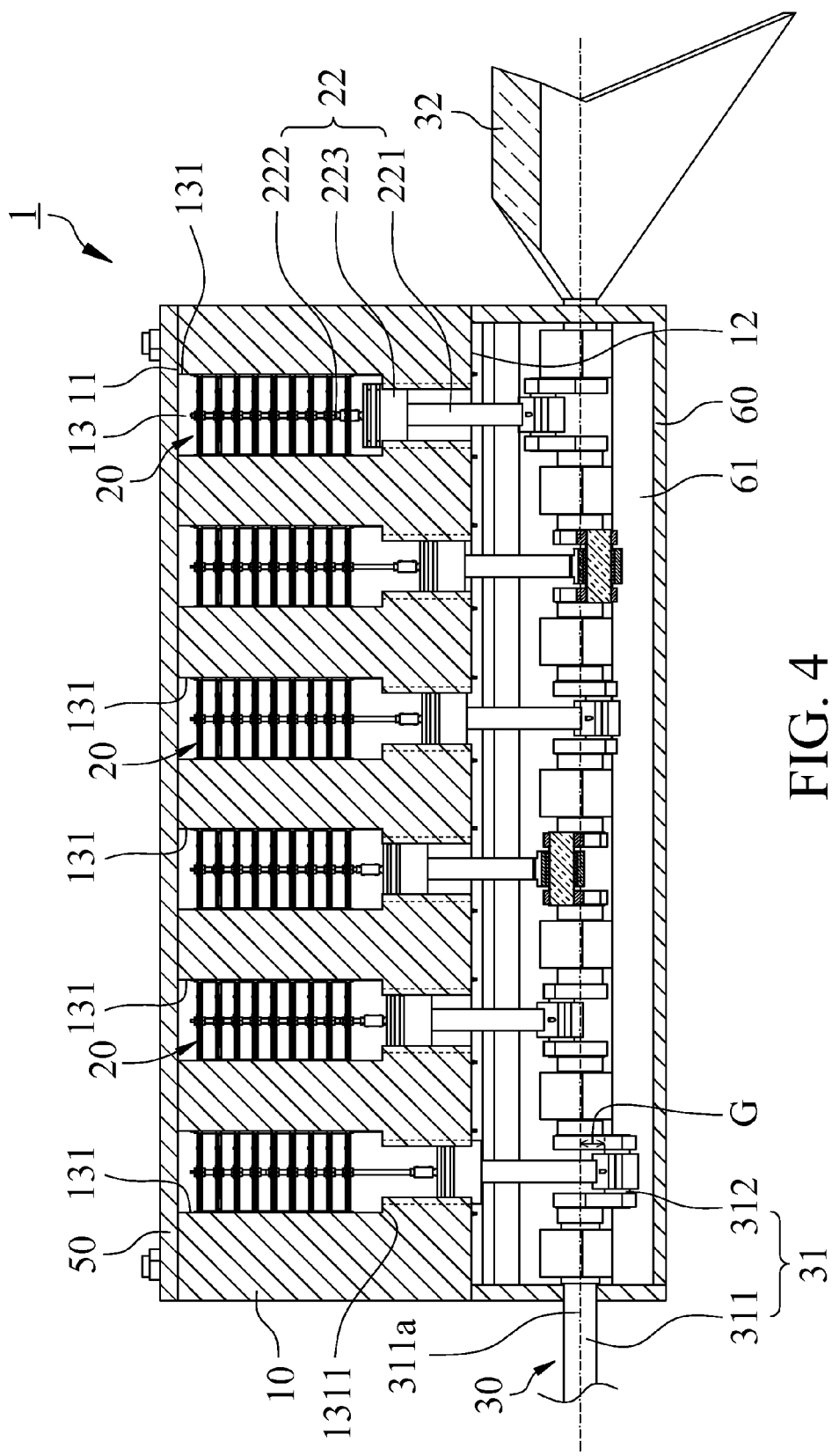
FIG. 4 is a lateral section view illustrating the piezoelectric power apparatus in accordance with an embodiment of the present invention.
Figure 5:
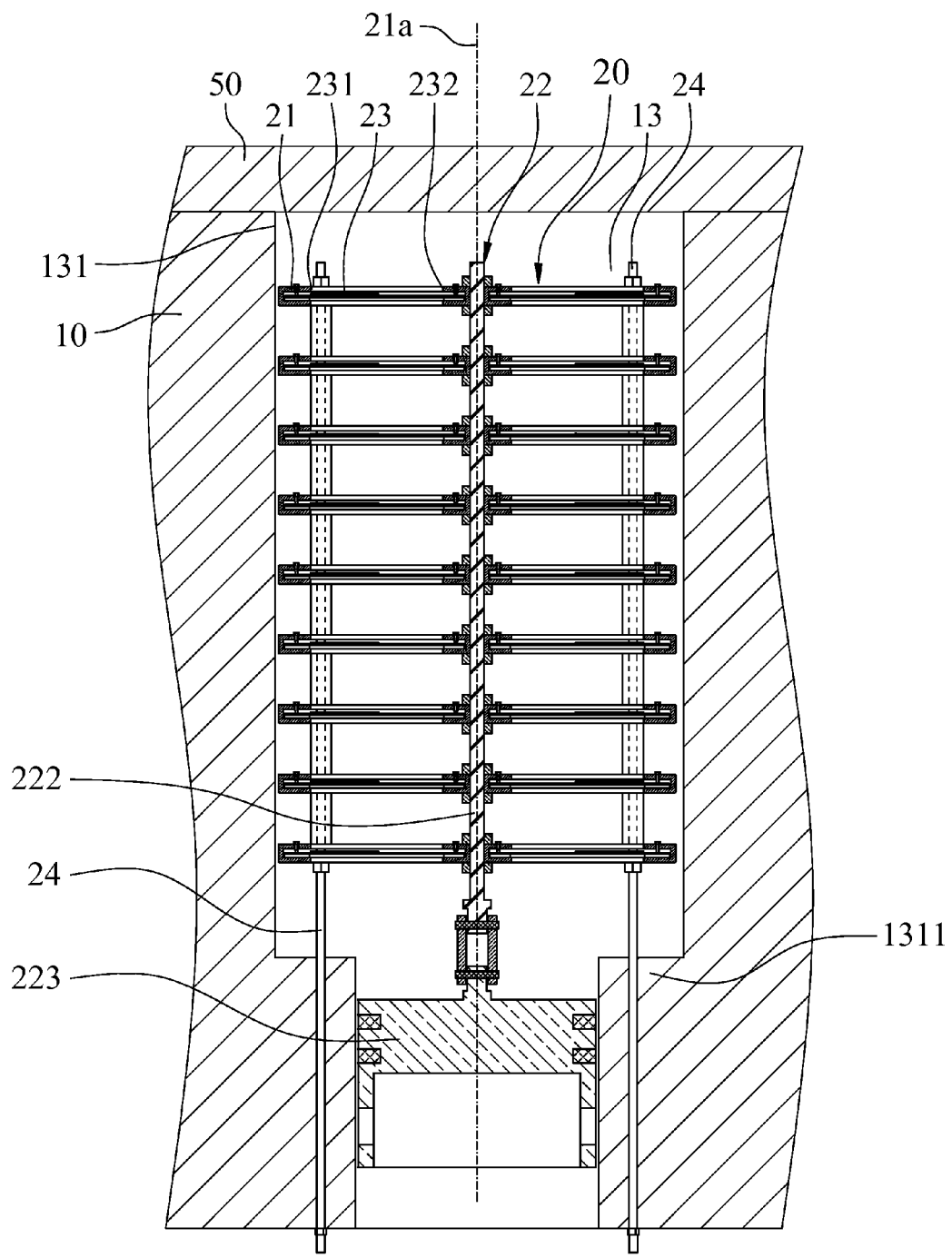
FIG. 5 is a lateral section view illustrating a piezoelectric module of the piezoelectric power apparatus in accordance with an embodiment of the present invention.

Referring to FIGS. 2, 3 and 4, a piezoelectric power apparatus 1 in accordance with an embodiment of the present invention comprises a first case 10, a plurality of piezoelectric modules 20 and a rotating member 30, wherein the first case 10 has a bottom surface 12 and a plurality of hollow chambers 13 recessed into the bottom surface 12, and each of the piezoelectric modules 20 is disposed into each of the hollow chambers 13. Referring to FIGS. 4 and 5, each of the piezoelectric modules 20 comprises at least one frame body 21, a moving member 22 and a plurality of piezoelectric portions 23. The moving member 22 is penetrated into the frame body 21. Each of the piezoelectric portions 23 comprises a first end 231 and a second end 232, each of the first ends 231 is fixed at the frame body 21, each of the second ends 232 is fixed at the moving member 22, and the moving member 22 is pivotally disposed at the rotating member 30. The moving member 22 of each of the piezoelectric modules 20 is pivotally disposed at the rotating member 30. With reference to FIGS. 4 and 5, the frame body 21 further comprises an axis line 21a, and the moving member 22 is located at the axis line 21a of the frame body 21. Preferably, the axis line 21a is the center line of the frame body 21. The moving member 22 is driven by the rotating member 30 to move back and forth in the frame body 21.

Referring to FIGS. 3, 4 and 5, in this embodiment, the rotating member 30 comprises a crank rod 31 having a rod 311 and a plurality of cranks 312 protruded from the rod 311, and each of the cranks 312 is pivotally disposed at the moving member 22 of each of the piezoelectric modules 20. The rod 311 comprises a center line 311a, a gap G is formed between each of the cranks 312 and the center line 311a, and each of the gaps G has the same length. When the moving member 22 of each of the piezoelectric modules 20 is moved back and forth in the frame body 21, the moving member 22 of each of the piezoelectric modules 20 possesses the same displacement via the same length of each of the gaps G. With reference to FIGS. 2 and 4, in this embodiment, the piezoelectric power apparatus 1 further comprises a fan wheel 40, one end of the crank rod 31 is connected with the fan wheel 40, and the crank rod 31 is driven to rotate by the fan wheel 40. The fan wheel 40 is capable of being driven by wind force or wave power, in this embodiment, the fan wheel 40 is driven by wind force. The rotating member 30 further comprises an empennage 32 disposed at another end of the rod 311. With reference to FIGS. 3 and 4, in this embodiment, the first case 10 further comprises a top surface 11, and each of the hollow chambers 13 is in communication with the top surface 11 and the bottom surface 12. The piezoelectric power apparatus 1 further comprises a lid 50 and a second case 60, the lid 50 is disposed at the top surface 11 of the first case 10, and the second case 60 is disposed at the bottom surface 11 of the first case 10. The second case 60 comprises an accommodating slot 61 in communication with the hollow chambers 13, and the crank rod 31 is disposed at the accommodating slot 61.

Figure 6:
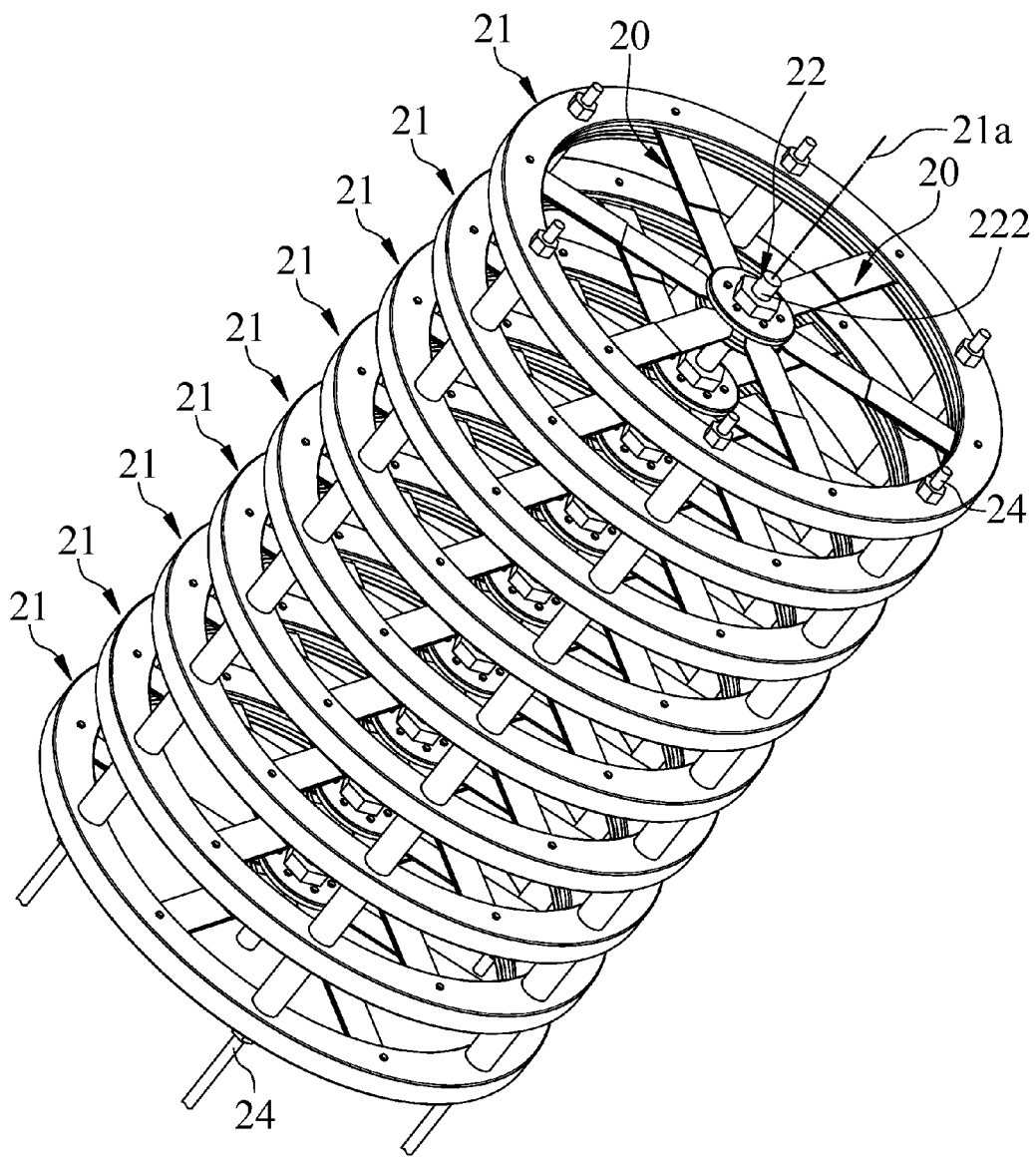
FIG. 6 is another perspective assembly view illustrating the piezoelectric power apparatus in accordance with an embodiment of the present invention.

Referring to FIGS. 4 and 5, the moving member 22 comprises a first rod 221, a second rod 222 and a sliding member 223 connected with the first rod 221 and the second rod 222. Each of the hollow chambers 13 comprises an inner wall 131, and the sliding member 223 is located in the inner wall 131. A protrusion 1311 is protruded from each of the inner walls 131. In this embodiment, the second rod 222 is located at the hollow chamber 13, and the second end 232 of the piezoelectric portion 23 is fixed at the second rod 222. When the moving member 22 is moved back and forth in the frame body 21, the sliding member 223 can be utilized to prevent the moving member 22 from generating irregular fluctuation. With reference to FIGS. 5 and 6, each of the piezoelectric modules 20 further comprises a plurality of through rods 24, the through rods 24 are penetrated through the frame body 21 and fixed at the protrusion 1311 of the first case 10 to fasten the piezoelectric module 20. This invention enables the moving member 21 of each of the piezoelectric modules 20 to be driven by the crank rod 312 of the rotating member 30 so that the quantity of the piezoelectric module 20 can be effectively increased. Accordingly, the power of the piezoelectric power apparatus 1 can be significantly raised.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A piezoelectric power apparatus comprising:
   a first case having a bottom surface and at least one hollow chamber recessed into the bottom surface;
   at least one piezoelectric module disposed in the hollow chamber, wherein the piezoelectric module comprises:
      at least one frame body,
      a moving member comprising a first rod and a second rod coupled to the first rod and
      a plurality of piezoelectric portions, wherein the second rod of the moving member is penetrated into the frame body, and wherein each of the piezoelectric portions comprises a first end and a second end, wherein each of the first ends is fixed at the frame body, and wherein each of the second ends is fixed at the second rod of the moving member, and wherein the second rod of the moving member is moved back and forth in the frame body; and
   a rotating member having a crank rod and an empennage, wherein the crank rod comprises a rod and a plurality of cranks protruded from the rod, the empennage is disposed at another end of the rod, wherein one end of the first rod of the moving member is pivotally disposed at the crank of the rotating member and wherein the first rod of the moving member is driven by the rotating member and wherein the plurality of piezoelectric portions are driven by the second rod,
   wherein the rod comprises a center line, and a gap is formed between each of the cranks and the center line.

2. The piezoelectric power apparatus in accordance with claim 1 further comprises a fan wheel, one end of the crank rod is connected with the fan wheel, and the crank rod is driven to rotate by the fan wheel.

3. The piezoelectric power apparatus in accordance with claim 1, wherein each of the gaps has the same length.

4. The piezoelectric power apparatus in accordance with claim 1, wherein one end of the first rod is pivotally disposed at the crank.

5. The piezoelectric power apparatus in accordance with claim 1, wherein the moving member further comprises a sliding member, the hollow chamber comprises an inner wall, and the sliding member is located in the inner wall.

6. The piezoelectric power apparatus in accordance with claim 1, wherein the first case further comprises a top surface, the hollow chamber is in communication with the top surface and the bottom surface.

7. The piezoelectric power apparatus in accordance with claim 6 further comprises a lid disposed at the top surface of the first case.

8. The piezoelectric power apparatus in accordance with claim 1 further comprises a second case disposed at the bottom surface of the first case, the second case comprises an accommodating slot in communication with the hollow chamber, and the crank rod is disposed at the accommodating slot.

* * * * *